United States Patent [19]

Smith

[11] Patent Number: 4,977,493
[45] Date of Patent: Dec. 11, 1990

[54] EFFICIENT SNUBBER FOR RECTIFIER CIRCUITS

[75] Inventor: David A. Smith, Kowloon, Hong Kong

[73] Assignee: ASTEC International Limited, Hong Kong

[21] Appl. No.: 379,380

[22] Filed: Jul. 13, 1989

[30] Foreign Application Priority Data

Jul. 14, 1988 [GB] United Kingdom ................. 8816774

[51] Int. Cl.$^5$ ............................................ H02M 7/06
[52] U.S. Cl. ...................................... 363/126; 363/48; 363/53
[58] Field of Search ..................... 363/48, 53, 125, 126

[56] References Cited

U.S. PATENT DOCUMENTS

| | | | |
|---|---|---|---|
| 3,955,131 | 5/1976 | Piccone et al. | 363/124 |
| 4,230,955 | 10/1980 | Johannessen | 363/124 |
| 4,591,966 | 5/1986 | Smith | 363/126 |

OTHER PUBLICATIONS

Yamada, "A New Noise Suppressor with Amorphous Saturable Reactor", IEEE Proceeding, Apr. 1986, pp. 134–140.

Ninomiya, "Noise Suppression by Magnetic Snubbers in Switching Power Converters", IEEE Record, Apr. 1988, pp. 1133–1140.

Primary Examiner—Steven L. Stephan
Assistant Examiner—Jeffrey Sterrett
Attorney, Agent, or Firm—McCubbrey, Bartels, Meyer & Ward

[57] ABSTRACT

A rectifier circuit having a rectifier (D4) allowing current to flow in a forward direction to an output ($V_{OUT}$). A saturable inductor (L3) in series with the rectifier (D4) blocks reverse recovery rectifier current and directs it to an inductor (L4), the energy stored in that inductor re-setting the saturable inductor (L3) to allow subsequent flow of current in the forward direction to the rectifier (D4). A capacitor (C2) absorbs surplus energy from the inductor (L4) and a rectifier (D5) guides that surplus energy to the output ($V_{OUT}$). This rectifier circuit is particularly useful as part of a converter where an electronic switch repeatedly switches current through an inductor (L1) and the energy from the inductor (L1) is delivered to the output ($V_{OUT}$) via the rectifier circuit.

14 Claims, 6 Drawing Sheets

EFFICIENT SNUBBER FOR RECTIFIER CIRCUITS

FIELD OF THE INVENTION

This invention relates to improvements in power supplies. In particular the invention relates to an improved rectifier circuit for use in power supplies, e.g. boost convertor power supplies.

BACKGROUND OF THE INVENTION

Boost convertor circuits have an electronic switch controlling the current through an inductor. When the current is switched off, a high voltage is created across the inductor which passes through a rectifier to charge a capacitor to a higher voltage than the original supply voltage.

They tend to be operated at a high switching frequency to reduce the absolute value and accordingly the size of the inductor. However, at each switching cycle there is a small reverse recovery current passing to the electronic switch because of the finite time taken for the charge recombination within the rectifier. There have been many proposals to prevent this current but all tend to suffer from various disadvantages which are exacerbated at higher output voltages because higher voltage rectifiers have a longer charge recombination time.

Prior attempts to prevent this reverse current from harming the electronic switch have involved using an inductor to prevent the reverse current flow and wasting the resulting energy in a resistor or in the inductor itself.

SUMMARY OF THE INVENTION

The invention has therefore been made with these points in mind and aims to provide a more efficient rectifier circuit.

According to the invention there is provided a rectifier circuit comprising a rectifier intended to allow current to flow in a forward direction to an output, a saturable inductor allowing the ready passage of current in the forward direction but blocking reverse recovery rectifier current, inductor means through which reverse recovery rectifier current passes and for limiting that reverse recovery current, energy stored in those inductor means being used to re-set the saturable inductor to its saturation state for a subsequent flow of current in the forward direction, capacitor means for absorbing surplus energy from the inductor means, and rectifier means for guiding that surplus energy to the output.

By operating in this manner the reverse current flow is not wasted. The resulting circuit is therefore efficient in that the reverse current is not wasted as heat which would otherwise place limitations on the compactness of the overall circuit and involve problems of cooling the circuit.

In one embodiment of the invention, additional capacitor means are provided across the rectifier to aid in re-setting of the saturable inductor to its saturation state, and/or to slow down the application of reverse potential across the rectifier. This further reduces reverse recovery rectifier current.

The rectifier circuit will normally guide a flow of AC power to provide a DC output, and the source of that AC power can be a transformer. More than one rectifier circuit according to the invention can be provided to give a half- or full-wave DC output. Also a further inductor may be employed to smooth the flow of power from the source to the output.

According to one embodiment of the invention, the rectifier circuit is used as part of a convertor. Such a convertor may comprise a first inductor means to store energy which is repeatedly switched by an electronic switch, the switching controlling the energy stored in the inductor means to be delivered to the output through a rectifier circuit according to the invention.

According to another embodiment of the invention, in such a convertor additional rectifier means are provided to clamp the voltage across the electronic switch to the output voltage as a maximum, so reducing the maximum stress on the electronic switch. Also current limiting means such as another inductor are desirably provided in series with the switch to limit the initial current when it turns on so that the voltage across it has time to fall from the higher output voltage to the input voltage before it passes a high current. The energy in this additional inductor when the electronic switch becomes non-conducting is then desirably dissipated through the additional rectifier means for use together with the output potential so that it need not be wasted.

The invention is applicable to boost convertors where an inductor is provided in series with the rectifier circuit to charge an output capacitor, the inductor current being switched between on and off, e.g. between ground and the output, at high frequency by an electronic switch such as a field effect transistor. The invention is, however, also applicable to all forms of power convertor employing a transformer for isolation, e.g. where the electronic switch is in series with an inductor, such as a buck convertor, a circuit where the inductor is itself the load, e.g. an inductive motor, in a half or full bridge rectifier arrangement, a forward convertor, or a flyback convertor.

BRIEF DESCRIPTION OF THE DRAWINGS

The invention will now be described, by way of example, with reference to the accompanying drawings, in which.

DETAILED DESCRIPTION OF THE INVENTION

Figure 1:
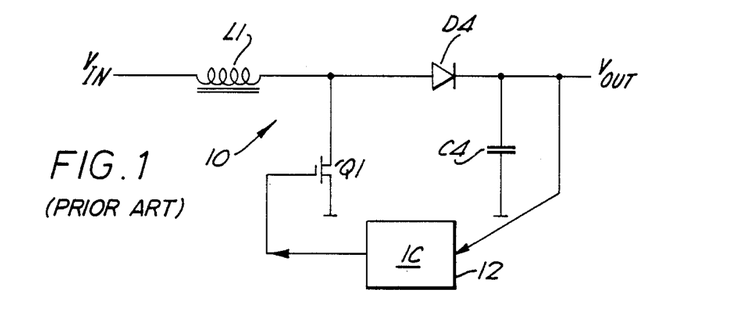
FIG. 1 is a circuit diagram of a simple boost convertor circuit.

The boost convertor circuit 10 shown in FIG. 1 includes a boost inductor L1 in the line between the input voltage $V_{IN}$ and output boosted voltage $V_{OUT}$. An electronic switch Q1 such as a field effect transistor (FET) is positioned between the output side of the inductor L1 and ground. The switch Q1 is rapidly oscillated between being switched on and switched off. When it is on, i.e. conducting, current passes through the inductor L1 to ground. When it switches off, this current is interrupted and this interruption creates a higher potential in the inductor L1.

A diode D4 is in series with the inductor L1 before a capacitor C4. The high potential created in the inductor L1 when the switch Q1 interrupts the current, passes through the diode D4 to be stored in the capacitor C4. The diode D4 prevent return loss of the charge stored in the capacitor C4.

It is desirable to cycle the switch Q1 at a high switching frequency, eg. at a frequency in the range of from 30 to 200 KHz, to reduce the value of the inductance L1 and hence its physical size. The switch Q1 is controlled in a conventional manner by a pulse width modulated control IC12, eg. Unitrode UC1842, which monitors and regulates the output voltage by driving switch Q1 at the correct duty cycle depending upon input voltage and output power.

A known problem with this basic boost circuit 10 is the finite time required for recombination of charges in the diode D1. Thus until these recombine, a reverse recovery current is possible. Therefore, a negative spike of reverse current can pass each time the switch Q1 switches off. Attempts to prevent this reverse current have not been particularly successful.

Figure 2:
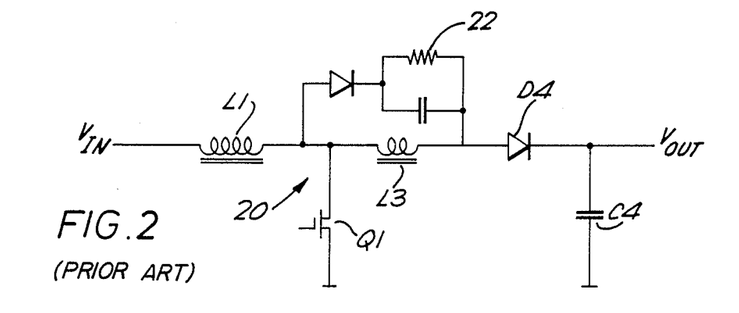
FIGS. 2 to 5 are circuit diagrams of prior boost convertor circuits.

For example, as shown in the circuit 20 of FIG. 2, a small inductor L3 may be provided between the inductor L1 and diode D4. Alternatively as shown in the circuit 30 of FIG. 3, a saturable reactor L3 can be used. Again as shown in the circuit 40 of FIG. 4, that saturable reactor L3 can be positioned in series with the switch Q1. The circuit 30 shown in FIG. 3 also has a turn-on snubber L2 and turn off snubber components comprising resistor R1 and capacitor C1.

Figure 3:
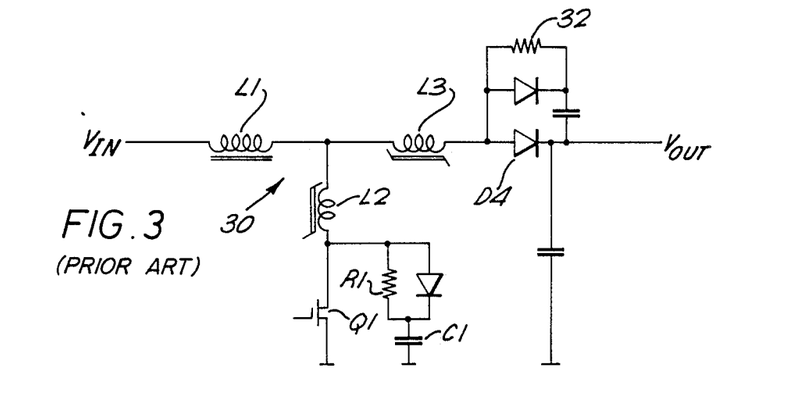
Figure 4:
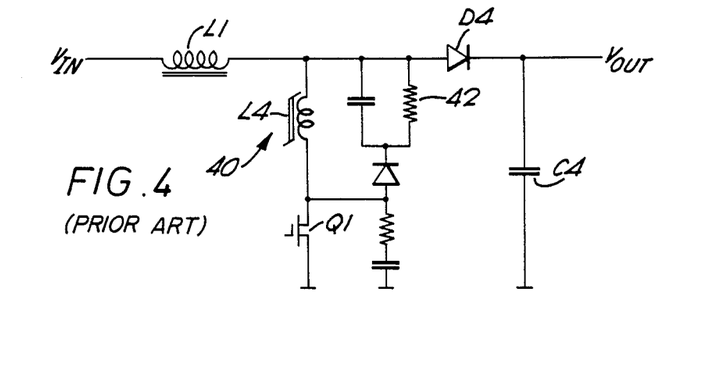

The saturable reactor L3 used in the circuit 30 of FIG. 3 normally has an amorphous core which has the property of being able to switch between low impedance (saturation) and high impedance with low core losses. When current from the inductor L1 is flowing through diode D4, inductor L3 is low impedance ($+B_{SAT}$) When the switch Q1 turns on, inductor L3 switches to high impedance and core flux density decreases towards $-B_{SAT}$. During this time there is charge recombination within the diode D4. If the diode D4 does not fully turn off before inductor L3 reaches $-B_{SAT}$, there will then be a high reverse current flow from the diode D4 into the switch Q1 which is undesirable.

The flux density of inductor L3 must be returned to $+B_{SAT}$ before switch Q1 turns off, otherwise the current through the inductor L1 will not be able to flow into the diode D4 and an excessive voltage stress will be applied by inductor L1 to the switch Q1. Several circuits have been designed to achieve this, but in general they suffer from the disadvantage of requiring a resistor to dissipate surplus energy, (i.e. the resistor 22 in FIG. 2, 32 in FIG. 3 and 42 in FIG. 4). Power dissipated by the resistor increases with switching frequency as with all resistance/capacitance snubber circuits, and this is one limit on the maximum switching frequency.

Figure 5:
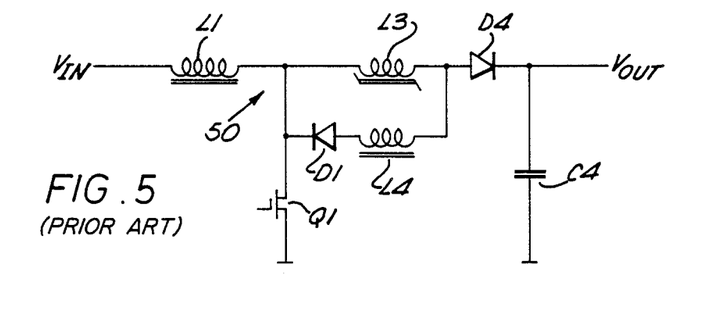

Referring to FIG. 5, the circuit 50 shown therein has been proposed using a linear inductor L4 and rectifier D1 in parallel with a saturable reactor L3 to re-set the reactor L3 to $+B_{SAT}$ as described by T. Yamada et al "A New Noise Suppression with Amorphous Saturable Reactor," IEEE APEC Proceeding April 1986, PP. 134–140. The purpose of this circuit was to suppress output switching noise due to diode reverse current in switching power supply output rectifiers. The circuit was applied to a boost convertor as show in FIG. 5 by T. Ninomiya et al, "Noise Suppression by Magnetic Snubber in Switching Power Convertors", IEEE PESC Record April 1988 pp. 1133–1140.

When the switch Q1 tuns on, a reverse current $I_{rr}$ flows through diode D1 and inductor L4. After reverse recovery time $t_{rr}$, the diode D4 turns off and inductor L4 puts a reverse voltage across the reactor L3 to return its flux density back to $+B_{SAT}$. Unfortunately, this also puts a high surge reverse voltage across the diode D4, typically 2 to 3 times $V_{OUT}$. When switch Q1 turns off, reactor L3 is not totally saturated and a high surge voltage appears across the switch Q1. However the circuit does have the advantage of allowing a controlled higher reverse current $I_{rr}$ than with only the amorphous saturable reactor, resulting in shorter turn off time. Reactor L3 has to withstand fewer volt-seconds ($V_{OUT} \times t_{rr}$) and can therefore be physically smaller. Alternatively, since fewer volt-seconds cause a smaller flux swing and lower heat dissipation in the core of the reactor L3 the switching frequency can be increased, which will again increase dissipation in the core of the reactor L3.

The problems caused by $I_{rr}$ and $t_{rr}$ are worse at higher output voltages because high voltage rectifiers have a longer turn off time $t_{rr}$, and so reactor L3 and inductor L4 have to withstand more volt-seconds.

Figure 6:
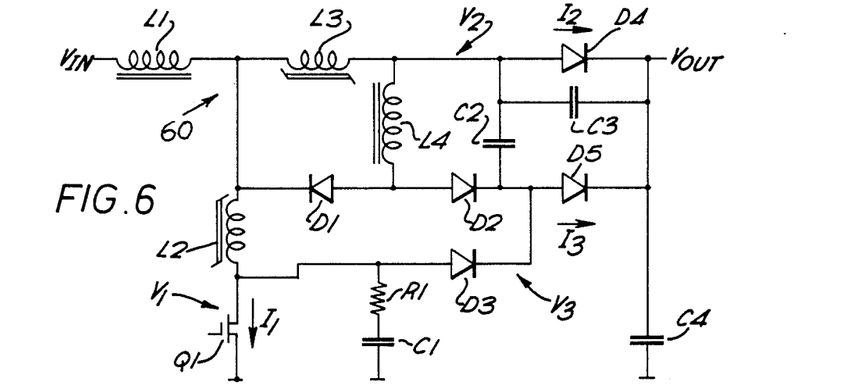
FIG. 6 is a circuit diagram of a boost convertor circuit incorporating a rectifier circuit to the present invention.

The circuit 60 according to the invention and shown in FIG. 6 aims to overcome these problems and has been designed for use in a boost convertor having a $V_{OUT}$ output of 400v and having a $V_{IN}$ input voltage of 150V. In this circuit, equivalent components to those already described in connection with the circuits of FIG. 1 to 5 have been given identical references.

In the circuit 60 the saturable reactor L3 switches between saturation and high impedance, whilst the linear inductor L4 controls and limits reverse recovery current into the switch Q1 as described above. Some of the energy built up in inductor L4, i.e. $(1/2L\ I_{rr}^2)$, is used to return reactor L3 to $+B_{SAT}$, surplus energy being transferred to capacitor C2 and then to the output via a diode D5. Since surplus energy is transferred to the output load and not dissipated by a resistor, the efficiency of the boost convertor is improved and waste heat is reduced. Diode D3 returns energy in the turn-on snubber L2 to the output load and clamps the voltage across switch Q1 to $V_{OUT}$. The reverse voltage across diode D4 is limited by capacitor C2 to 1.1 to 1.2 times $V_{OUT}$. A typical switching frequency for the switch Q1 in 30 to 200 KHz.

Figure 7:
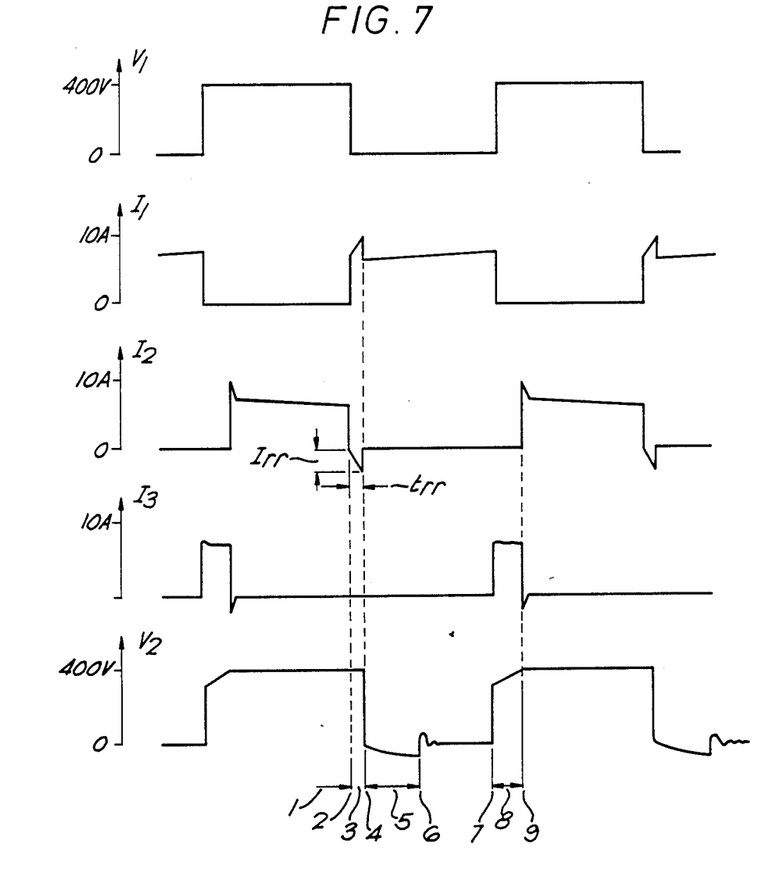
FIG. 7 is a waveform diagram for various parameters in the circuit shown in FIG. 6.

FIG. 7 shows key waveforms at various points in the circuit 60 of FIG. 6. The horizontal time axis is not drawn to scale for clarity of circuit operation. The following is a description of circuit operation during one switching cycle from time 1 through to time 9.

(1) Switch Q1 is off. Current flows from inductor L1 through reactor L3 and diode D4 to the output to charge capacitor C4.

(2) Switch Q1 turns on, and turn on snubber L2 limits switch Q1 turn on losses by allowing voltage across the switch to fall before current starts to flow in it.

(3)
   a. Saturable reactor L3 switches from saturation to high impedance.
   b. Diode D4 reverse recovery current flows through inductor L4, diode D1, snubber L2 and switch Q1. Current increases linearly at a rate $$\frac{dI}{dt} = \frac{V_{OUT}}{L4},$$

until diode D4 turns off after its recovery time $t_{rr}$.

c. Switch Q1 is conducting and passes inductor L1 current and diode D4 reverse recovery current.
d. Volt-seconds are applied equally to reactor L3 and inductor L4, reaching $V_{OUT} \times t_{rr}$ at the start of time 4.

(4)
a. Diode D4 stops conducting.
b. V2 falls to zero at a rate determined by values of inductor L4 and capacitor C3 plus the internal capacitance of diode D4.
c. The potential at point $V_3$ is clamped to zero by diode D3.
d. The reverse recovery current through diode D4 has stored energy in inductor L4 equal to $$\frac{L4}{2} \times I_{rr}^2.$$

The charging of capacitor C3 to $V_{OUT}$ further increases this energy by $$\frac{C3}{2} \times V_{OUT}^2$$

(5)
a. Energy in inductor L4 is transferred to capacitor C2 via diode D2. Capacitor C2 is charged from zero in a quarter cycle resonance of inductor L4 and capacitor C2. Time interval $$5 = \pi \frac{(L4\ C2)^{\frac{1}{2}}}{2}$$

Peak voltage across capacitor $$C2 = \left[ \frac{C3\ V_{OUT}^2 + L4\ I_{rr}^2}{C2} \right]^{\frac{1}{2}}$$

b. During time 5, inductor L4 applies a voltage across the saturable reactor L3 through diode D1 equal to the voltage across capacitor C2. The flux density on inductor L4 returns to zero, and hence reactor L3 flux density returns to $+B_{SAT}$.
(6) V2 returns to zero whilst capacitor C2 remains charged.
(7)
a. Switch Q1 turns off, and the high frequency snubber composed of capacitor C1 and resistor R1 damps stray circuit LC resonances.
b. Inductor L3 is taken further into saturation by the discharging of capacitor C3.
c. Voltage on switch Q1 is clamped by diode D3 plus diode D5 to $V_{OUT}$. Energy in inductor L2 is transferred via diode D3 to the output.
(8) Inductor L1 current flows through capacitor C2 and diode D5 until capacitor C2 is discharged to the forward recovery voltage of diode D4. This is a relatively high RMS ripple current, and capacitor C2 should be a good quality capacitor such as polypropylene.
(9)
a. Inductor L1 current flows through diode D4.
b. Reverse recovery current of diode D5 appears as a forward current spike in diode D4.
c. Capacitor C2 becomes fully discharged to zero, ready for the next cycle time 5.

The choice of the value of capacitance C2 is a compromise between:
a. lower capacitance whereby it will charge in a shorter time interval 5, allowing the boost convertor to be designed to operate at a higher switching frequency, and
b. higher capacitance whereby there will be lower voltage stress on diode D4 but increasing time interval 5.

If the minimum switch "on" time for the switch Q1 is less than the time interval 5, reactor L3 will still be at high impedance when switch Q1 turns off. Current from inductor L1 will then flow through inductor L2 and diodes D3 and D5 to the output.

The waveforms shown in FIG. 7 are for circuit conditions with the following typical values of circuit components and operating conditions:

| | |
|---|---|
| $V_{IN}$ = | 150 V |
| $V_{OUT}$ = | 400 V |
| $I_{IN}$ = | 6.5 A |
| L1 = | 800 μH |
| L4 = | 20 μH |
| C2 = | 33 hF |
| C3 = | 120 pF |
| Q1 "on" time = | 5 μs |
| Q1 period = | 8 us |
| D4 Irr = | 2 A |
| D4 trr = | 150 ns |
| time interval 5 = | 1.3 μs |
| time interval 8 = | 400 ns. |

Figure 8:
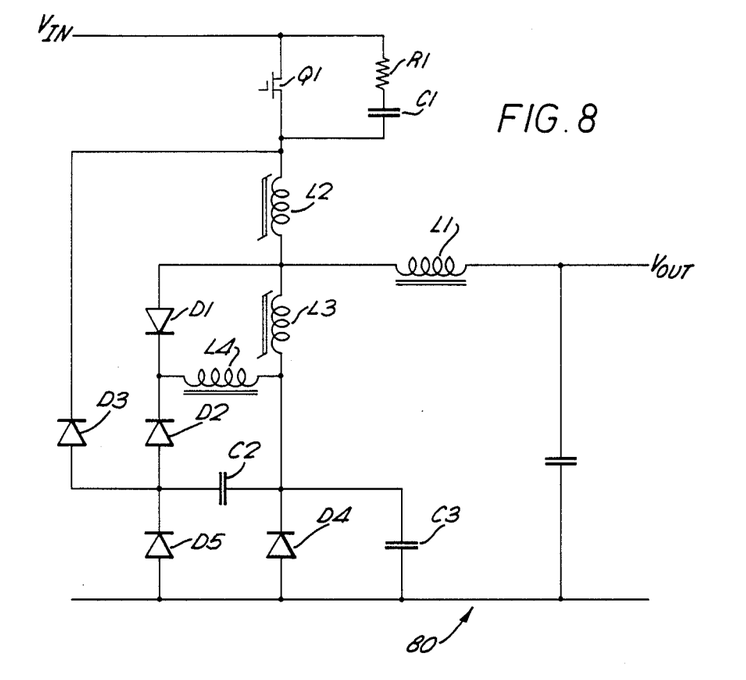
FIGS. 8 and 12 are circuit diagrams of various forms of convertor incorporating a rectifier circuit according to the invention.
Figure 9:
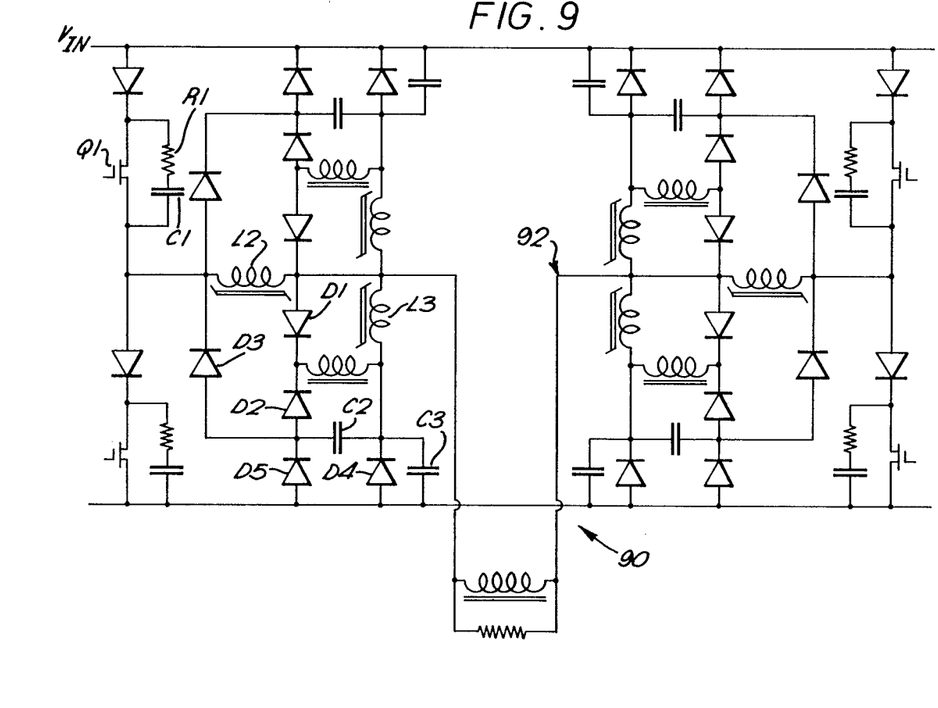

Circuit operation has been described for the particular circuit topology of a boost convertor. The invention, however, may be applied to any other switching power convertor employing a power switch and inductive current catch rectifier driving an inductive load, e.g. a motor. The circuit 80 shown in FIG. 8 is for a buck convertor according to the invention whilst the circuit 90 shown in FIG. 9 shows a full bridge invertor according to the invention used in un-interruptable power supplies. Again the same references are used for equivalent components in FIGS. 8 and 9 as are used in FIG. 6.

In both circuits the inductive load L1 is driven by the switch Q1. Inductive current flows through the catch rectifier D4 and saturable reactor L3. When switch Q1 turns on, reactor L3 switches to it's high impedance state, and reverse current in rectifier D4 flows in to diode D1 and inductor L4. When diode D4 turns off after the time $t_{rr}$, energy stored in inductor L4 is used to drive the flux in reactor L3 back into saturation ($+B_{SAT}$) whilst capacitor C2 is being charged up. The maximum reverse voltage across diode D4 is $V_{IN}$ plus the voltage across capacitor C2. When switch Q1 turns off, the reactor L3 is driven further into saturation by capacitor C3 discharging, and inductive load current flows through diode D5, capacitor C2 and reactor L3. When capacitor C2 is discharged by this current, diode D4 starts to conduct. Inductor L2 is a turn on snubber, diode D3 limits the voltage across the switch Q1 to $V_{IN}$, and capacitor C1 and resistor R1 act as a high frequency snubber.

Although the circuit 90 shown in FIG. 9 is a full bridge circuit, a half bridge circuit according to the invention is equally possible. Thus, for example, the right-hand side of the circuit 90 shown in FIG. 9 could be replaced with two series connected capacitors between $V_{IN}$ and ground, and the point 92 taken to the common point of the capacitors.

Figure 10:
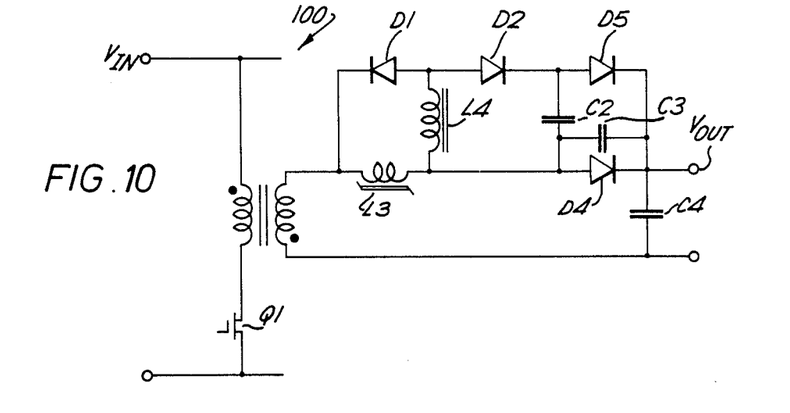
Figure 11:
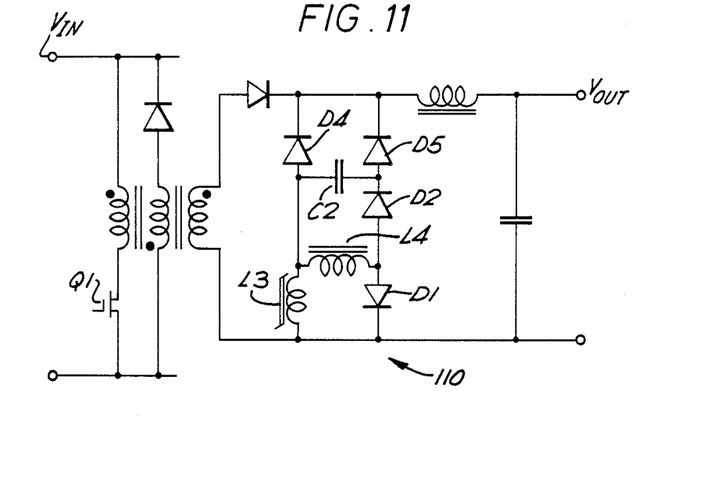
Figure 12:
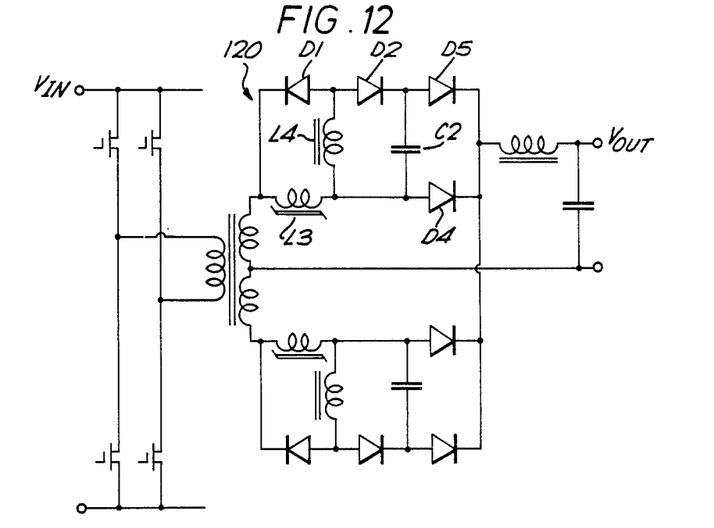

The invention may be applied to any switching power convertor employing a transformer for isolation. The circuit 100 of FIG. 10 shows a fly back convertor using the invention, the circuit 110 of FIG. 11 shows a forward convertor using the invention, and the circuit 120 of FIG. 12 shows a full bridge using the invention.

In these Figures the same references are used for equivalent parts used in FIG. 6 and it is believed that circuit operation will be readily understood from the previous description.

The improvement in rectifier performance is of particular advantage when the DC output voltage is high, e.g. 48V DC as used in communication equipment, requiring the use of high voltage rectifiers which have relatively long reverse recovery times. When the electronic switch closes, the rectifier reverse recovery current acts as a short circuit across the transformer secondary winding, resulting in a high surge current in the electronic switch. The improved rectifier circuit described above according to the invention reduces this surge current and reduces reverse voltage stress on the rectifier.

What is claimed is:

1. A rectifier circuit comprising a rectifier intended to allow current to flow in a forward direction to an output, a saturable inductor allowing the ready passage of current in the forward direction but blocking reverse recovery rectifier current, inductor means through which reverse recovery rectifier current passes and for limiting that reverse recovery current, energy stored in those inductor means being used to re-set the saturable inductor to its saturation state for a subsequent flow of current in the forward direction, capacitor means for absorbing surplus energy from the inductor means, and rectifier means for guiding that surplus energy to the output.

2. A rectifier circuit as claimed in claim 1 in which additional capacitor means are provided across the rectifier to aid in re-setting of the saturable inductor to its saturation state, and/or to slow down the application of reverse potential across the rectifier.

3. A rectifier circuit as claimed in either preceding claim in which the power supplied to the rectifier is an alternating source of power.

4. A rectifier circuit as claimed in claim 3 in which the alternating source of power is the output from a transformer.

5. In a converter circuit including a first inductor means to store energy which is repeatedly switched by an electronic switch, the switching controlling the energy stored in said first inductor means to be delivered to an output, a rectifier circuit for directing the energy stored in said first inductor to said output means comprising:
a first rectifier intended to allow current to flow in a forward direction from said first inductor means to said output;
a saturable inductor allowing the ready passage of current in the forward direction of said first rectifier but blocking reverse recovery current of said first rectifier;
a second inductor means through which said reverse recovery current of said first rectifier passes, said second inductor means limiting said reverse recovery current, the energy stored in said second inductor means being used to reset said saturable inductor to its saturation state for a subsequent flow of current through said first rectifier in the forward direction of said first rectifier;
storage capacitor means for absorbing surplus energy from said second inductor means; and
a second rectifier for guiding said surplus energy to said output.

6. The converter circuit of claim 5 wherein said first inductor means is coupled in series with said rectifier circuit.

7. The converter circuit of claim 5 wherein said rectifier circuit further comprises a third rectifier for clamping the voltage across said electronic switch to said output such that said voltage across said electronic switch is limited to a predetermined maximum value.

8. The converter circuit of claim 7 further comprising means for limiting the initial current to said electronic switch means when it turns on such that the voltage across said electronic switch has time to decrease before said electronic switch passes a high current.

9. The converter circuit of claim 8 wherein said means for limiting the initial current to said electronic switch comprises a second saturable inductor connected in series with said electronic switch.

10. The converter circuit of claim 9 wherein the energy in said second saturable inductor is coupled through said third rectifier to said output when the electronic switch becomes non-conducting.

11. A rectifier circuit having an input terminal and an output terminal, comprising:
a first rectifier comprising a cathode terminal coupled to said output terminal of said rectifier circuit and an anode terminal, said first rectifier intended to allow current to flow in a forward direction to said output;
a saturable inductor having a first terminal coupled to the input terminal of said rectifier circuit and a second terminal coupled to the anode of said first rectifier, said saturable inductor allowing the ready passage of current in the forward direction of said first rectifier but blocking reverse recovery current of said first rectifier;
an inductor means having a first terminal and a second terminal, said second terminal coupled to the second terminal of said saturable inductor and to the anode terminal of said first rectifier, said inductor means storing said reverse recovery current from said first rectifier and limiting said reverse recovery current, the resulting energy stored in said inductor means being used to reset said saturable inductor to its saturation state for a subsequent flow of current through said first rectifier in the forward direction of said first rectifier;
a second rectifier comprising an anode terminal coupled to the first terminal of said inductor means and a cathode terminal coupled to the first terminal of said saturable inductor, said second rectifier coupling energy stored in said inductor means to said saturable inductor so as to reset said saturable inductor;
a first capacitor having a first terminal coupled to the anode terminal of said first rectifier and a second terminal, said first capacitor absorbing surplus energy from said inductor means;

a third rectifier comprising an anode terminal coupled to the first terminal of said inductor means and a cathode terminal coupled to the second terminal of said first capacitor, said third rectifier coupling said surplus energy from said inductor means to said first capacitor; and a fourth rectifier comprising an anode terminal coupled to the second terminal of said first capacitor and a cathode terminal coupled to the output terminal of said rectifier circuit, said fourth rectifier guiding said surplus energy stored in said first capacitor to the output terminal of said rectifier circuit.

12. The rectifier circuit in claim 11 further comprising a second capacitor connected across said first rectifier, said second capacitor further enabling the reset of said saturable inductor to its saturation state and slowing down the application of reverse potential across said first rectifier.

13. A rectifier circuit having an input terminal and an output terminal, comprising:

a first rectifier comprising an anode terminal coupled to the input terminal of said rectifier circuit and a cathode terminal, said first rectifier intended to allow current to flow in a forward direction to said output;

a saturable inductor having a first terminal coupled to the output of said rectifier circuit and a second terminal coupled to the cathode of said first rectifier, said saturable inductor allowing the ready passage of current in the forward direction of said first rectifier but blocking reverse recovery current of said first rectifier;

an inductor means having a first terminal and a second terminal, said second terminal coupled to the second terminal of said saturable inductor and to the cathode terminal of said first rectifier, said inductor means storing said reverse recovery current from said first rectifier and limiting said reverse recovery current, the resulting energy stored in said inductor means being used to reset said saturable inductor to its saturation state for a subsequent flow of current through said first rectifier in the forward direction of said first rectifier;

a second rectifier comprising a cathode terminal coupled to the first terminal of said inductor means and an anode terminal coupled to the first terminal of said saturable inductor, said second rectifier coupling energy stored in said inductor means to said saturable inductor so as to reset said saturable inductor;

a first capacitor having a first terminal coupled to the cathode terminal of said first rectifier and a second terminal, said first capacitor absorbing surplus energy from said inductor means;

a third rectifier comprising a cathode terminal coupled to the first terminal of said inductor means and an anode terminal coupled to the second terminal of said first capacitor, said third rectifier coupling said surplus energy from said inductor means to said first capacitor; and a fourth rectifier comprising a cathode terminal coupled to the second terminal of said first capacitor and an anode terminal coupled to the input of said rectifier circuit.

14. The rectifier circuit in claim 13 further comprising a second capacitor connected across said first rectifier, said second capacitor further enabling the reset of said saturable inductor to its saturation state and slowing down the application of reverse potential across said first rectifier.

* * * * *